United States Patent
Kang et al.

(10) Patent No.: US 7,218,558 B2
(45) Date of Patent: May 15, 2007

(54) SEMICONDUCTOR MEMORY DEVICES HAVING COLUMN REDUNDANCY CIRCUITS THEREIN THAT SUPPORT MULTIPLE MEMORY BLOCKS

(75) Inventors: Sang-Chul Kang, Gyeonggi-do (KR); Hyung-Min Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 141 days.

(21) Appl. No.: 10/999,182

(22) Filed: Nov. 29, 2004

(65) Prior Publication Data

US 2006/0044918 A1    Mar. 2, 2006

(30) Foreign Application Priority Data

Aug. 30, 2004    (KR)    ............ 10-2004-0068653

(51) Int. Cl.
- G11C 7/00    (2006.01)
- G11C 7/10    (2006.01)
- G11C 17/18    (2006.01)
- G11C 8/00    (2006.01)

(52) U.S. Cl. .............. 365/200; 365/189.02; 365/225.7; 365/230.03

(58) Field of Classification Search ................ 365/200, 365/230.03
See application file for complete search history.

(56) References Cited

U.S. PATENT DOCUMENTS 5,416,740 A * 5/1995 Fujita et al. ................ 365/200
5,848,003 A * 12/1998 Nishikawa ................... 365/200
6,304,500 B1 * 10/2001 Kyung et al. ................ 365/200
6,414,896 B1 * 7/2002 Kim et al. .............. 365/230.03
6,519,192 B2 * 2/2003 Ooishi ......................... 365/200
6,584,022 B2 * 6/2003 Tsuji ............................ 365/200
6,621,749 B2 * 9/2003 Lee ............................. 365/200
2001/0028584 A1 * 10/2001 Nakayama et al. ......... 365/203
2002/0001896 A1    1/2002 Yoon

FOREIGN PATENT DOCUMENTS

KR    1020020002913 A    1/2002
KR    1020030044413 A    6/2003

* cited by examiner

Primary Examiner—Huan Hoang
Assistant Examiner—Ly Duy Pham
(74) Attorney, Agent, or Firm—Myers Bigel Sibley & Sajovec, P.A.

(57) ABSTRACT

Semiconductor memory devices include a memory array having a plurality of multi-column memory blocks therein and a multi-column redundant memory block. A redundancy column selecting unit is provided, which is configured to route data read from the multi-column redundant memory block to a redundant data line, in response to a column address. A data input/output unit is also provided. This data input/output unit is connected to the redundant data line and a data line associated with a defective column in the memory array. The data input/output unit is configured to respond to an instruction to read first data from a defective column in the memory array by routing first data read from a selected redundant column in the multi-column redundant memory block to an input/output bus while concurrently blocking data read from the defective column from being transferred to the input/output bus.

7 Claims, 12 Drawing Sheets

| F[2:0] | D[7:0] |
|---|---|
| 0 0 0 | 0 0 0 0 0 0 0 1 |
| 0 0 1 | 0 0 0 0 0 0 1 0 |
| 0 1 0 | 0 0 0 0 0 1 0 0 |
| 0 1 1 | 0 0 0 0 1 0 0 0 |
| 1 0 0 | 0 0 0 1 0 0 0 0 |
| 1 0 1 | 0 0 1 0 0 0 0 0 |
| 1 1 0 | 0 1 0 0 0 0 0 0 |
| 1 1 1 | 1 0 0 0 0 0 0 0 |

SEMICONDUCTOR MEMORY DEVICES HAVING COLUMN REDUNDANCY CIRCUITS THEREIN THAT SUPPORT MULTIPLE MEMORY BLOCKS

REFERENCE TO PRIORITY APPLICATION

This application claims priority to Korean Application Ser. No. 2004-68653, filed Aug. 30, 2004, the disclosure of which is hereby incorporated herein by reference.

FIELD OF THE INVENTION

The present invention relates to integrated circuit devices and, more particularly, to integrated circuit memory devices having column redundancy.

BACKGROUND OF THE INVENTION

Figure 2:
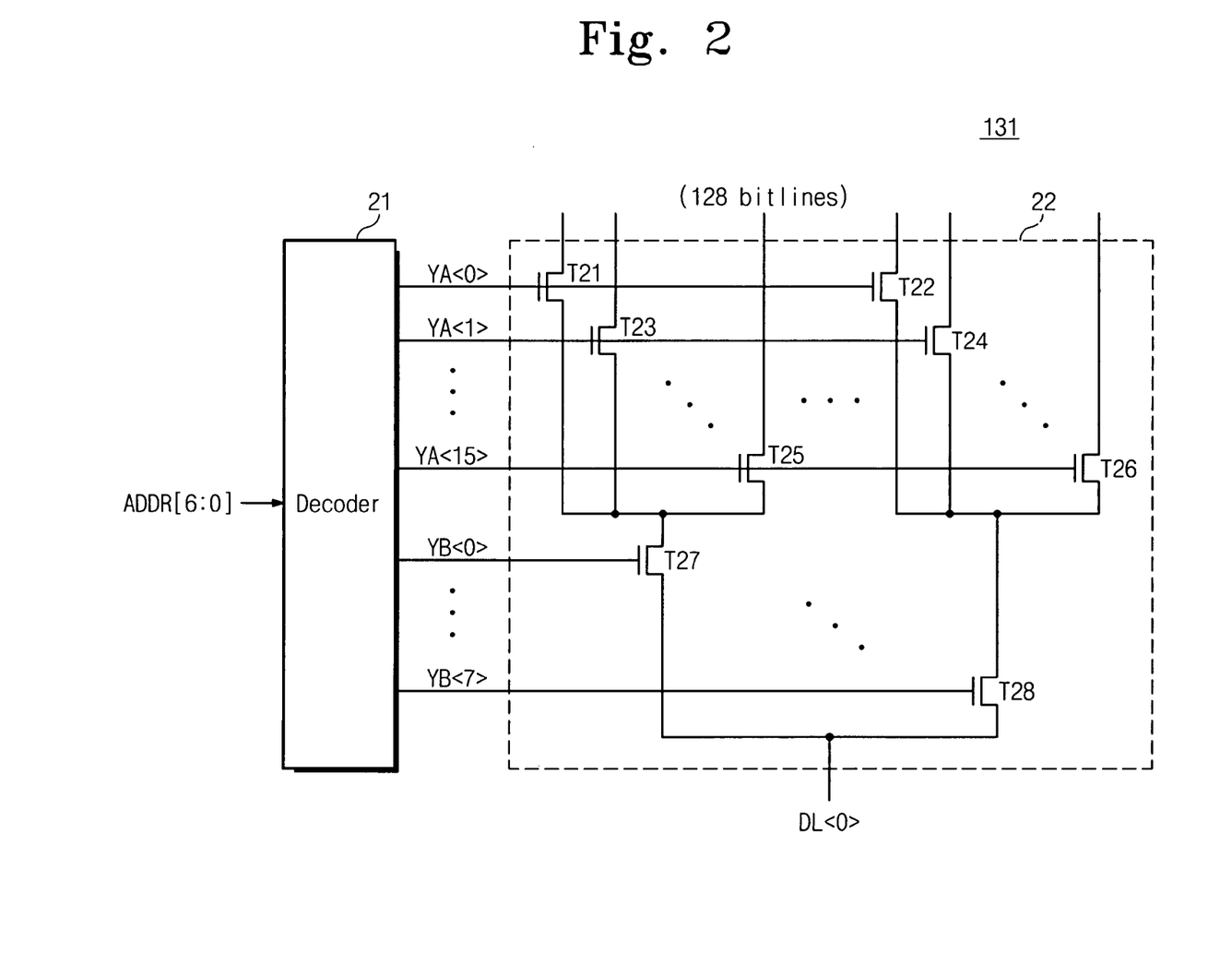
FIG. 2 is an electrical schematic of a column selecting unit illustrated by FIG. 1.

Volatile and non-volatile memory devices (e.g., RAM, ROM) frequently include column redundancy circuits to repair one or more defective columns within a memory array block. An example of a memory device that supports column redundancy is disclosed in U.S. Patent Publication No. 2002/0001896 to Yoon. In particular, FIG. 2 of Yoon illustrates a memory device having a plurality of blocks of memory cells therein. Each of these blocks of memory cells is illustrated by the reference characters DQ0–DQn. Memory cell block DQ0 includes a plurality of columns of memory cells 22 that may be selectively coupled to a corresponding global input/output line GIO<0> using a corresponding write driving and read sense amplification unit 26. Similarly, memory cell block DQn includes a plurality of columns of memory cells 32 that may be selectively coupled to a corresponding global input/output line GIO<n> using a corresponding write driving and read sense amplification unit 36. FIG. 2 of Yoon also illustrates a fuse box unit 48 that may be configured so that a plurality of columns of repair memory cells 43 may be used to repair one or more columns within a memory cell block (DQ0–DQn) having at least one defective column of memory cells therein. Unfortunately, the memory device of Yoon may provide an inefficient use of the columns of repair memory cells 43 for those cases where the number of columns of repair memory cells 43 connected to a corresponding repair column decoding unit 45 exceeds a number of defective columns of memory cells within a memory cell block (DQ0–DQn) being repaired. For example, if two or more columns of repair memory cells 43 are associated with each repair column decoding unit 45, then one or more of these columns of repair memory cells 43 may go unused in the event a memory cell block (DQ0–DQn) being repaired contains only one defective column of memory cells therein. Accordingly, the memory device of Yoon may provide a relatively inefficient means for repairing defective columns within a multi-block memory device.

SUMMARY OF THE INVENTION

Embodiments of the present invention include integrated circuit memory devices having columns of redundant memory cells therein that support repairing of defective memory cells within a multi-block memory array. These memory devices include a memory array having a plurality of multi-column memory blocks therein and at least one multi-column redundant memory block. A redundancy column selecting unit is provided. This redundancy column selecting unit is configured to route data read from the multi-column redundant memory block to a redundant data line, in response to a column address. A data input/output unit is also provided. This data input/output unit is connected to the redundant data line and a data line associated with a defective column in the memory array. The data input/output unit is configured to respond to an instruction to read first data from a defective column in the memory array by routing first data read from a selected redundant column in the multi-column redundant memory block to an input/output bus while concurrently blocking data read from the defective column from being transferred to the input/output bus.

In some embodiments of the present invention, the redundancy column selecting unit includes a fuse box configured to generate a plurality of redundancy column selection signals in response to a column address and the data input/output unit is responsive to a plurality of input/output selection signals, which are generated by an input/output selection signal generating unit. This input/output selection signal generating unit is responsive to the plurality of redundancy column selection signals generated by the fuse box. In particular, the input/output selection signal generating unit includes a decoding unit responsive to the plurality of redundancy column selection signals.

In additional embodiments of the present invention, the data input/output unit includes a plurality of multiplexers. One of these multiplexers may have first and second data terminals that are electrically connected to the data line and the redundant data line, respectively, and a control terminal responsive to a corresponding one of the input/output selection signals. A redundancy data input unit may also be provided. The redundancy data input unit has an output connected to the redundant data line, a first plurality of inputs connected to the input/output bus and a second plurality of inputs responsive to the plurality of input/output selection signals.

Still further embodiments of the present invention include an integrated circuit memory device having a plurality of multi-column memory blocks therein and at least one multi-column redundant memory block. A column selecting unit is provided. The column selecting unit is coupled to a plurality of bit lines in a corresponding one of the plurality of multi-column memory blocks and is responsive to a column address. A redundant column selecting unit is also provided. The redundant column selecting unit is coupled to a plurality of bit lines in the multi-column redundant memory block and is responsive to the column address. A data input/output unit is connected to the column selecting unit and the redundant column selecting unit and responsive to a plurality of input/output selection signals. These signals are generated by an input/output selection signal generator, which is responsive to a plurality of redundancy column selection signals generated by the redundant column selecting unit. The data input/output unit includes at least one multiplexer having first and second data terminals connected to the column selecting unit and the redundant column selecting unit, respectively. The at least one multiplexer also has a control terminal responsive to a corresponding one of the plurality of input/output selection signals.

In some of these embodiments, the redundant column selecting unit will include a fuse box that is configured to generate the plurality of redundancy column selection signals in response to the column address. A redundancy data input unit is also provided, which has an output connected to the redundant column selecting unit, a first plurality of inputs connected to an input/output bus and a second plurality of inputs responsive to the plurality of input/output selection signals.

DESCRIPTION OF PREFERRED EMBODIMENTS

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals.

Figure 1:
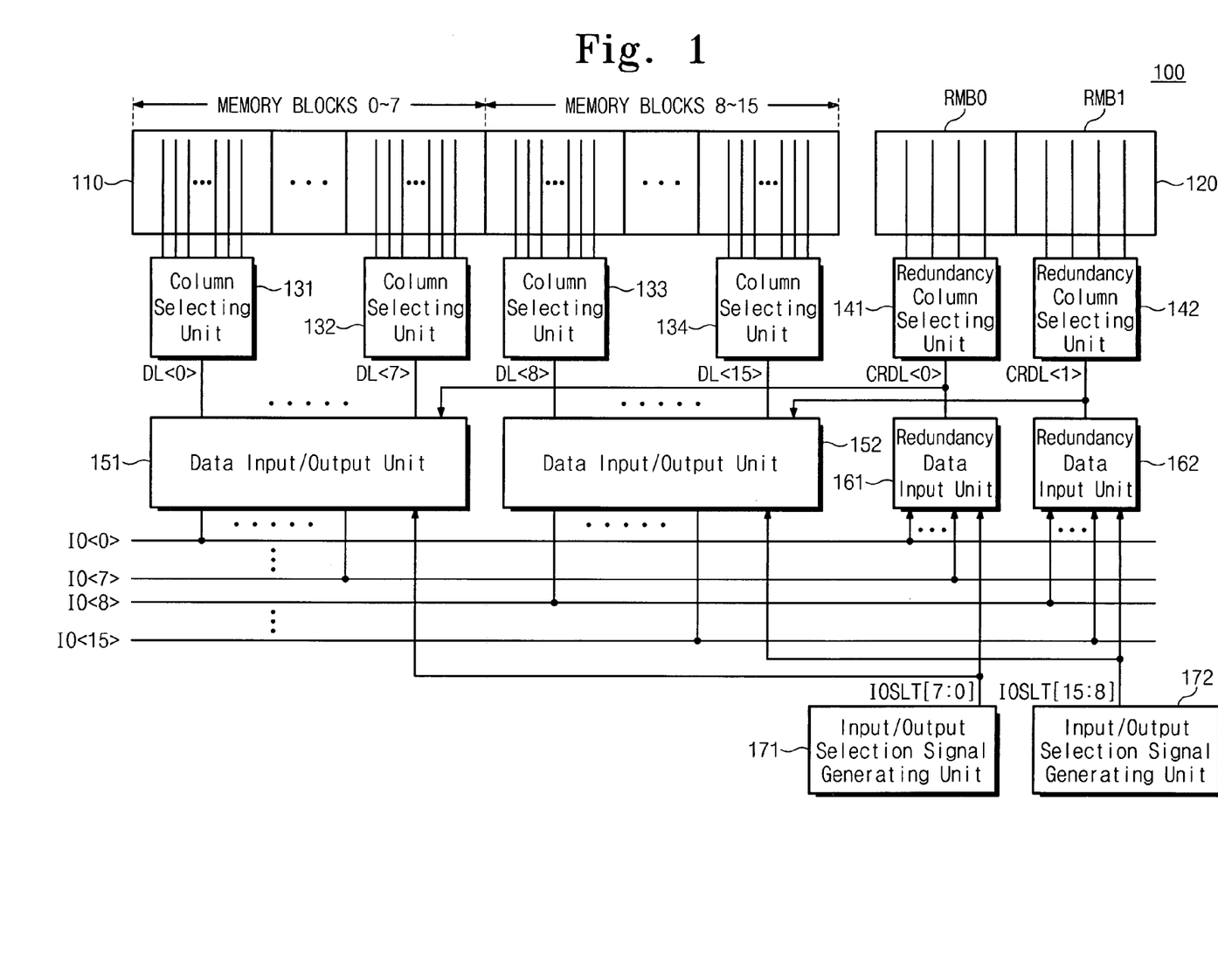
FIG. 1 is a block diagram of an integrated circuit memory device according to embodiments of the present invention.

As illustrated by FIG. 1, a semiconductor memory device 100 according to embodiments of the present includes a multi-block memory array 110 and a redundant memory array 120. The multi-block memory array 110 is illustrated as including sixteen memory blocks (i.e., blocks 0–15). Each of these memory blocks is electrically coupled to a respective column selecting unit. Four of these sixteen column selecting units are illustrated by the reference numerals 131–134. The redundant memory array 120 is illustrated as including a pair of redundant memory blocks (RMB0 and RMB1), with each of these redundant memory blocks being electrically coupled to a respective redundant column selecting unit 141 and 142. Each of the memory blocks within the memory array 110 is illustrated as including 128 columns of memory cells. The bit lines associated with these 128 columns of memory cells are electrically coupled to a respective column selecting unit. Each of the memory blocks within the redundant memory array 120 is illustrated as including four redundant columns of memory cells. The bit lines associated with each of the redundant memory blocks in the redundant memory array 120 are electrically coupled to a respective one of the redundant column selecting units 141 and 142. As described more fully herein below, the redundant column selecting unit 141 may be configured to support replacement of as many as four defective columns of memory cells within a first half of the memory array 110 (e.g., memory blocks 0–7) and the redundant column selecting unit 142 may be configured to support replacement of as many as four defective columns of memory cells within a second half of the memory array 110 (e.g., memory blocks 8–15). As further illustrated by FIG. 1, the eight column selecting units associated with memory blocks 0–7 are electrically coupled to a first data input/output unit 151 and the eight column selecting units associated with memory blocks 8–15 are electrically coupled to a second data input/output unit 152.

A first redundant column selecting unit 141 may be configured to provide data to the first data input/output unit 151 during memory reading operations. In particular, the first redundant column selecting unit 141 can be configured to provide read data to the first data input/output unit 151 when one or as many as four defective columns are present in memory blocks 0–7. In a similar manner, the second redundant column selecting unit 142 may be configured to provide data to the second data input/output unit 152 during memory reading operations.

The first eight lines of a 16-bit input/output bus (IO[15:0]) are electrically connected to the first data input/output unit 151 and a first redundancy data input unit 161 and the second eight lines of the 16-bit input/output bus are electrically connected to the second data input/output unit 152 and the second redundancy data input unit 162. The first and second data input/output units 151–152 and the first and second redundancy data input units 161–162 are controlled by first and second input/output selection signal generating units 171 and 172. As illustrated, the first input/output selection signal generating unit 171 is configured to generate one 8-bit selection signal IOSLT[7:0] and the second input/output selection signal generating unit 172 is configured to generate another 8-bit selection signal IOSLT[15:8].

FIG. 2 illustrates a configuration of the first column selecting unit 131 illustrated by FIG. 1. This column selecting unit 131 is electrically connected to 128 bit lines associated with a corresponding memory block 0 within the memory array 110. The first column selecting unit 131 is also electrically connected to the first data input/output unit 151 by a respective data line DL<0>. The first column selecting unit 131 is configured to electrically connect a selected one of the 128 bit lines to a corresponding data line DL<0>, in response to a 7-bit column address (ADDR[6:0]). In alternative embodiments of the present invention, each of the illustrated bit lines (BL) may be a single line or a pair of lines that support differential signals (e.g., BL and /BL). Similarly, the data line DL<0> may in some cases represent a pair of differential data lines (e.g, DL<0> and /DL<0>). The first column selecting unit 131 includes an address decoder 21, which receives the 7-bit column address ADDR [6:0], and a Y-gate column selection circuit 22. This Y-gate column selection circuit 22 includes eight column selection units and each of these column selection units includes 16 selection transistors. One column selection unit associated with a first group of sixteen bit lines 0–15 is illustrated by the transistors T21, T23, . . . T25 and another column selection unit associated with a last group of 16 bit lines 112–127 is illustrated by transistors T22, T24, . . . T26. Each of these sixteen column selection units is coupled to a respective output transistor which is electrically connected to a data line DL<0>. These sixteen output transistors are illustrated as T27 . . . T28. Based on this configuration of the Y-gate column selection circuit 22, each distinct one of the possible $2^7=128$ column addresses results in an electrical "short" between one of the 128 bit lines (or bit line pairs) and the corresponding data line DL<0>.

Figure 3:
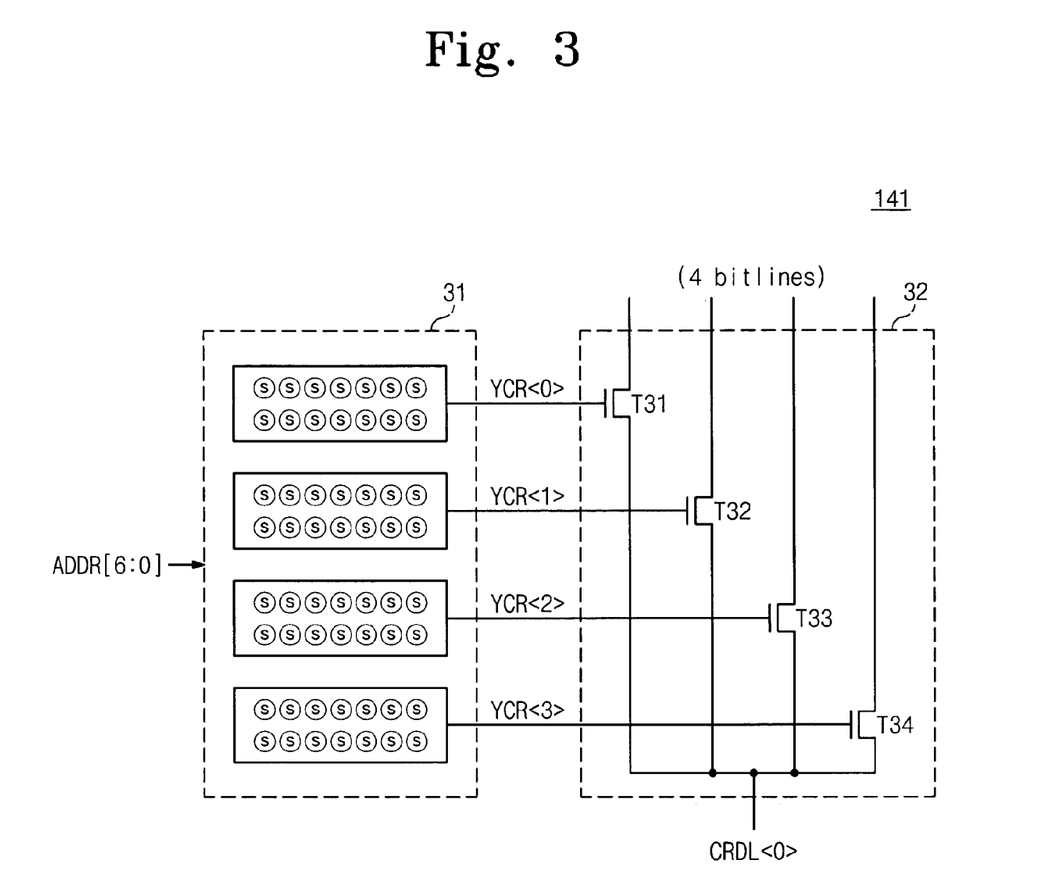
FIG. 3 is an electrical schematic of a redundant column selecting unit illustrated by FIG. 1.

The first redundant column selecting unit 141 is illustrated as including a fuse box 31 and a redundant Y-gate circuit 32. The fuse box 31, which is illustrated as including four (4) fuse units (containing fuse elements S), is responsive to the 7-bit column address ADDR[6:0]. Based on the setting of the fuse units within the fuse box 31, as many as four separate column addresses will result in the generation of four active redundancy column selection signals YCR[3:0]. Each of these redundancy column selection signals YCR[3:0], when active (e.g., at a high level), will cause a corresponding transistor T31–T34 in the Y-gate circuit 32 to be turned-on to thereby connect a respective bit line within the first redundant memory block RMB0 to the first column redundancy data line CRDL<0>. Accordingly, if column 12 in memory block 1, column 24 in memory block 3, column 33 in memory block 5 and column 52 in memory block 7 are all defective, then the redundancy column select signal YCR<0> will be active when the column address ADDR[6:0] equals 0001100, the redundancy column select signal YCR<1> will be active when the column address ADDR[6:0] equals 0011000, the redundancy column select signal YCR<2> will be active when the column address ADDR[6:0] equals 0100001 and the redundancy column select signal YCR<3> will be active when the column address ADDR[6:0] equals 0110100.

Similarly, the second redundant column selecting unit 142 in FIG. 1 may include a fuse box and a redundant Y-gate circuit like those shown in FIG. 3. Based on the setting of fuse units within the fuse box, as many as four separate column addresses will result in the generation of four active redundancy column selection signals YCR[7:4] (not shown). Each of these redundancy column selection signals YCR[7:4], when active (e.g., at a high level), will cause a corresponding bit line in the second redundant memory block RMB1 to be connected to the second column redundancy data line CRDL<1>. Accordingly, if column 15 in memory block 8, column 26 in memory block 9, column 35 in memory block 14 and column 54 in memory block 15 are defective, then the redundancy column select signal YCR<4> will be active when the column address ADDR[6:0] equals 0001111, the redundancy column select signal YCR<5> will be active when the column address ADDR[6:0] equals 0011010, the redundancy column select signal YCR<6> will be active when the column address ADDR[6:0] equals 0100011 and the redundancy column select signal YCR<7> will be active when the column address ADDR[6:0] equals 0110110.

Figure 4:
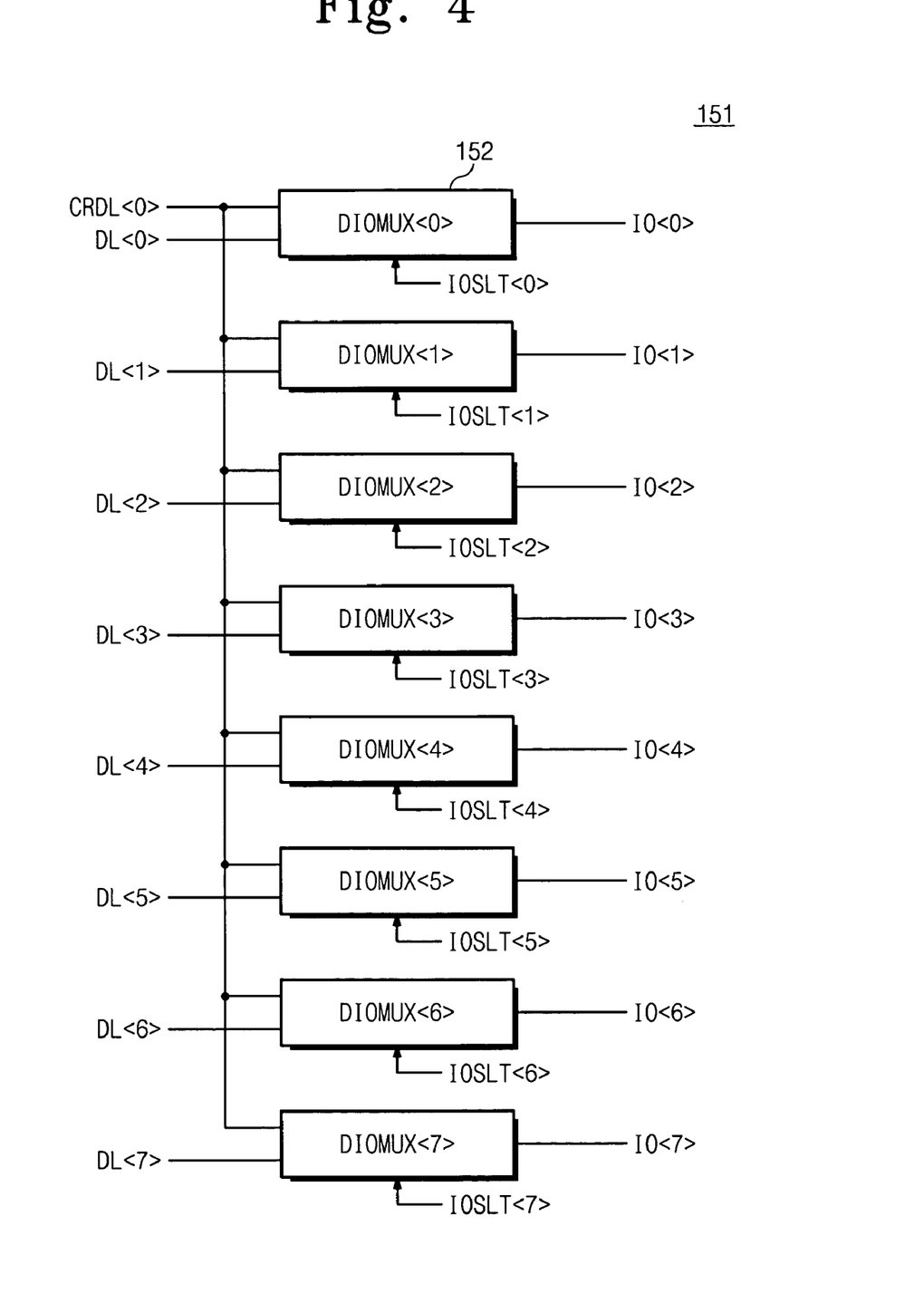
FIG. 4 is an electrical schematic of a data input/output unit illustrated by FIG. 1.

As illustrated by FIG. 4, the first data input/output unit 151 includes a plurality of data input/output multiplexers 152, which are shown as DIOMUX[7:0]. Each of these data input/output multiplexers 152 is connected to a corresponding one of the eight data lines DL[7:0] and a corresponding one of the eight input/output lines IO[7:0]. The data input/output multiplexers 152 are also commonly connected to the first column redundancy data line CRDL<0>. The data input/output multiplexers 152 within the first data input/output unit 151 operate under control of a plurality of input/output selection signals IOSLT[7:0]. These selection signals control whether or not the first column redundancy data line CRDL<0> is connected to one of the eight input/output lines IO[7:0] during a read operation from the memory array 110. In particular, the values of the input/output selection signals IOSLT[7:0] are controlled so that if column 12 in memory block 1 is defective, then IOSLT<1> will be set to an active high level when the column address ADDR[6:0] equals 0001100 (i.e., 12b). Likewise, if column 24 in memory block 3 is defective, then IOSLT<3> will be set to an active high level when the column address ADDR[6:0] equals 0011000 (i.e., 24b), and if column 33 in memory block 5 is defective, then IOSLT<5> will be set to an active high level when the column address equals 0100001 (i.e., 33b). The second data input/output unit 152 is also configured in a manner similar to the first data input/output unit 151 and need not be described further herein.

Figure 5:
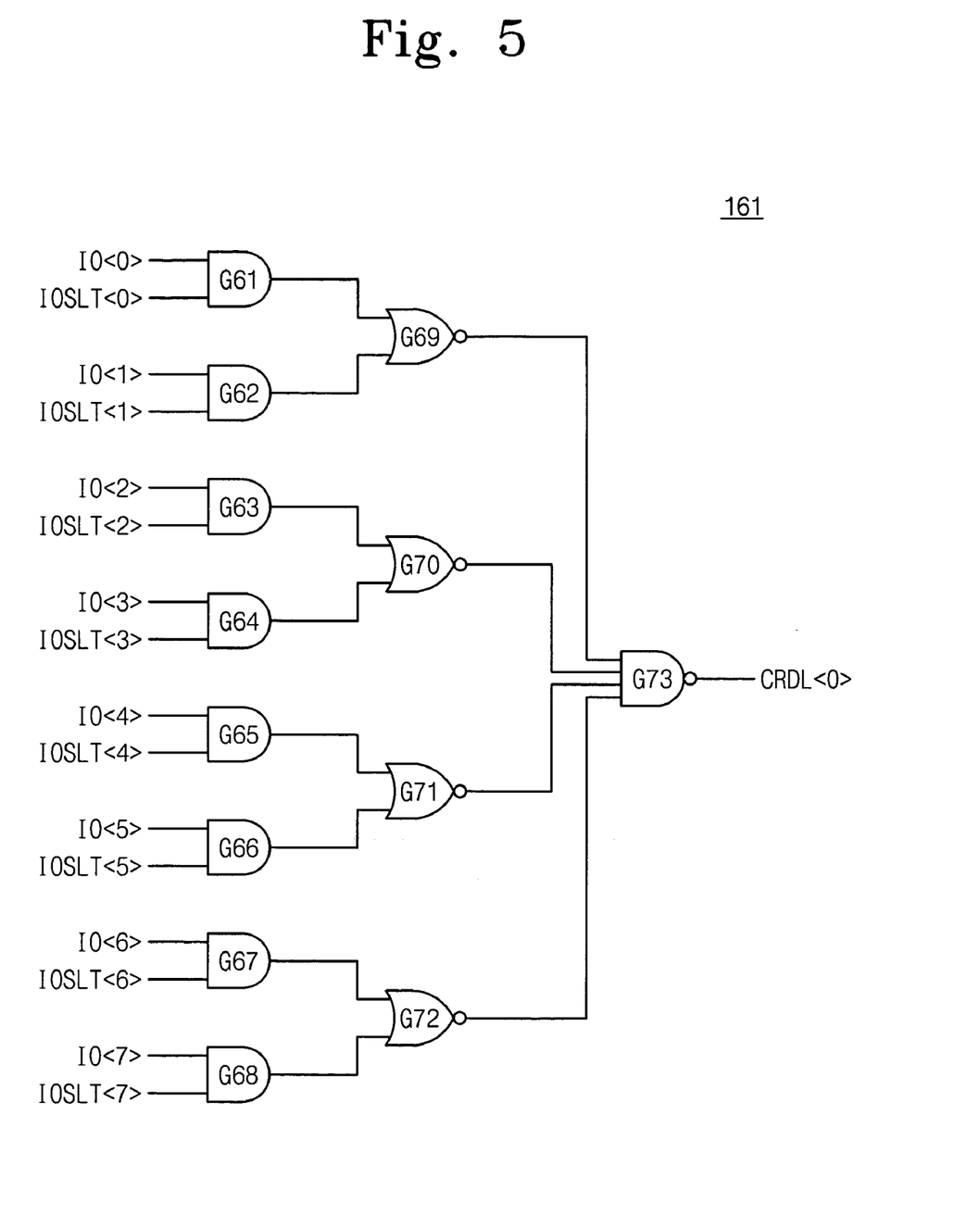
FIG. 5 is an electrical schematic of a redundant data input unit illustrated by FIG. 1.

FIG. 5 illustrates an electrical schematic of a first redundancy data input unit 161 having inputs that are configured to receive write data from the input/output lines IO[7:0] during memory write operations. As illustrated, the first redundancy data input unit 161 includes a plurality of input AND gates G61–G68, a plurality of intermediate NOR gates G69–G72 and an output NAND gate G73 that drives the first column redundancy data line CRDL<0> during write operations. The input AND gates G61–G68 receive the input/output signals IO[7:0] and the input/output selection signals IOSLT[7:0]. As described above with respect to FIG. 4, if column 12 in memory block 1 is defective, then IOSLT<1> will be set to an active high level when the column address ADDR[6:0] equals 0001100 (i.e., 12b). Likewise, if column 24 in memory block 3 is defective, then IOSLT<3> will be set to an active high level when the column address ADDR[6:0] equals 0011000 (i.e., 24b). The second redundancy data input unit 162 is also configured in a manner similar to the first redundancy data input unit 161 and need not be described further herein.

Figure 6:
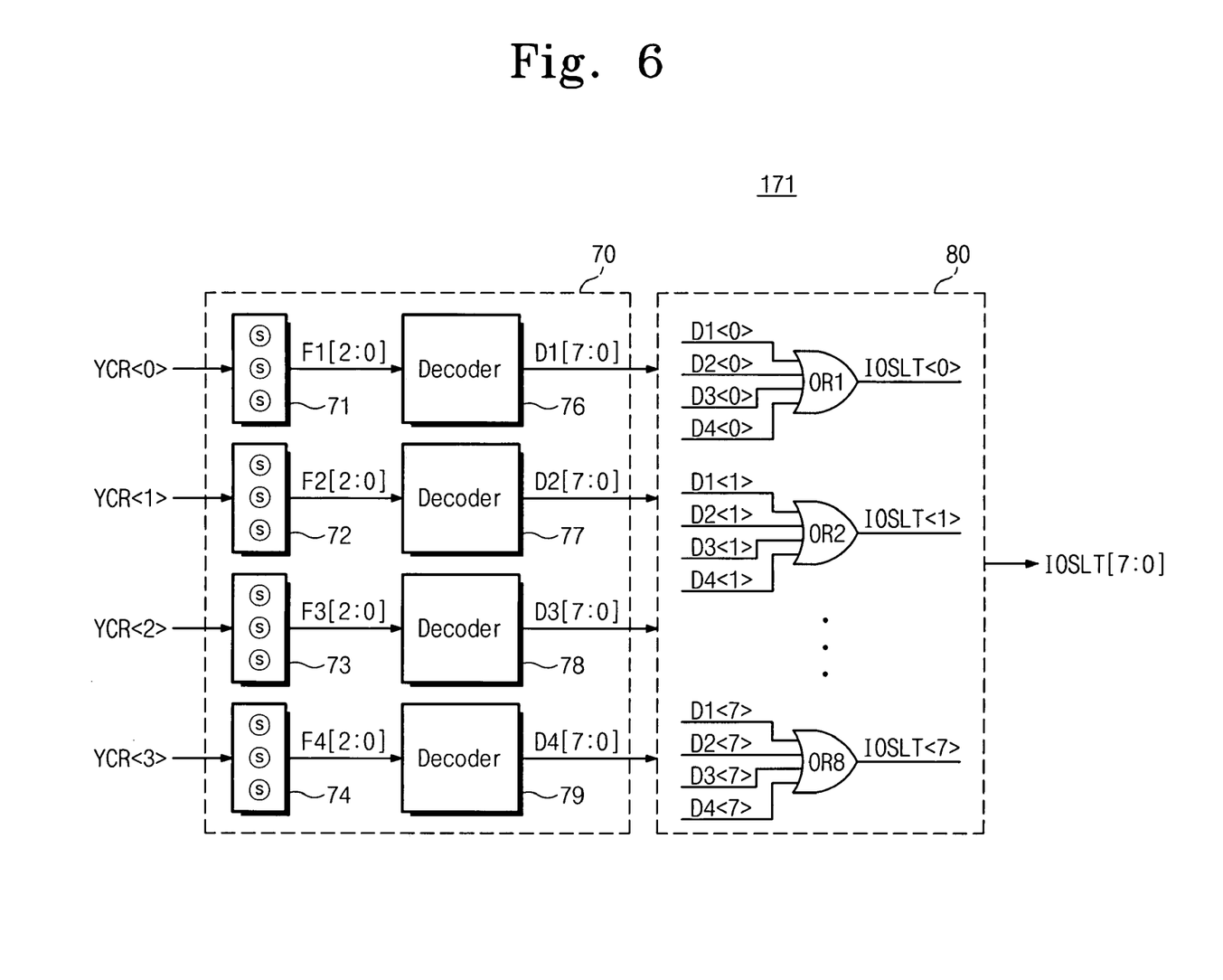
FIG. 6 is an electrical schematic of an input/output selection signal generation unit illustrated by FIG. 1.
Figure 7:
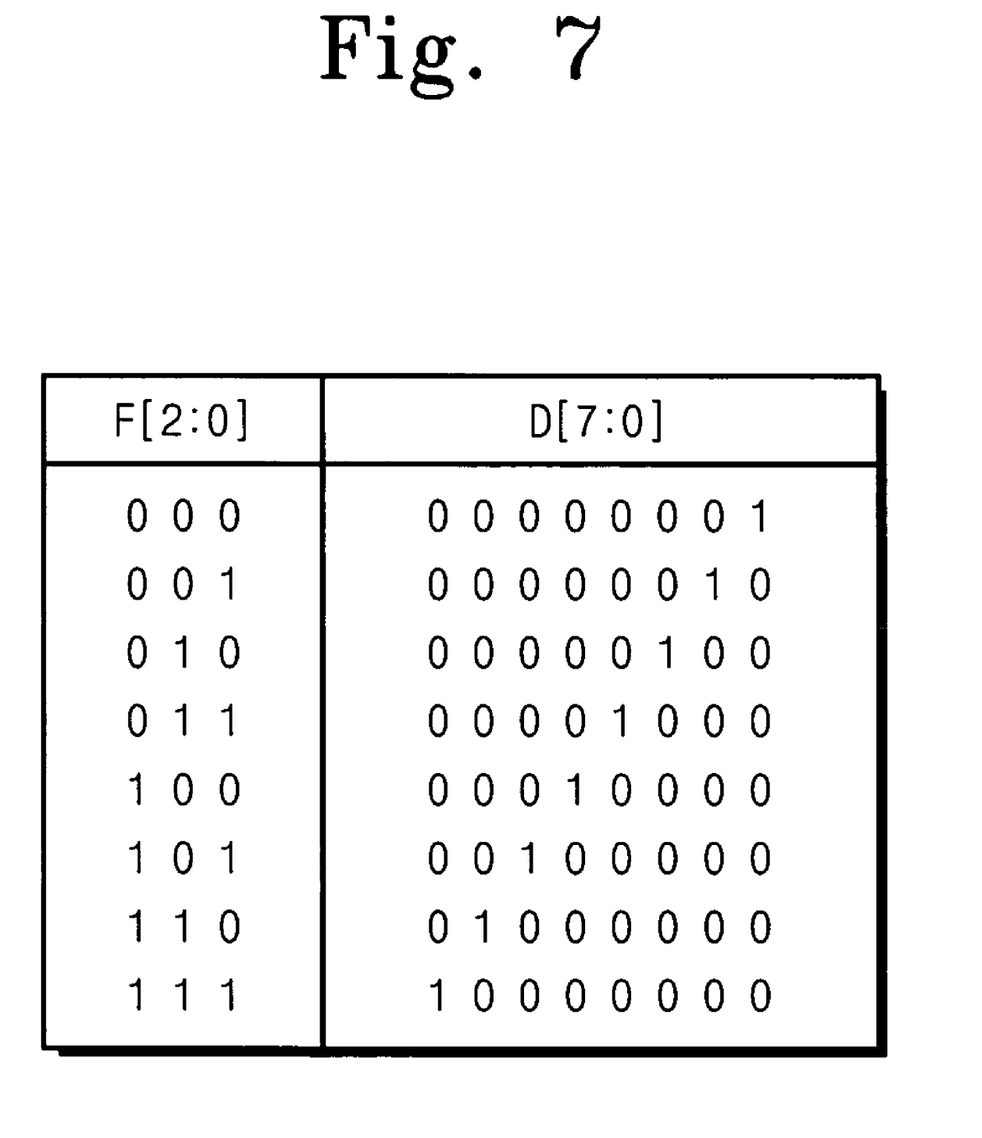
FIG. 7 is a table that illustrates a decoding operation performed by a decoder illustrated by FIG. 6.

FIG. 6 illustrates a configuration of the first input/output selection signal generating unit 171, which includes a decoding unit 70 and a gate unit 80. The decoding unit 70 is illustrated as including a plurality of fuse boxes 71–74 and a plurality of decoders 76–79. Each of the fuse boxes 71–74 is responsive to a respective one of the redundancy column selection signals YCR<3:0>. In particular, the fuse box 71 includes a plurality of fuse elements (S) that operate to generate a first fuse data signal F1[2:0]. This first fuse data signal F1[2:0] encodes the memory block address (memory block 0-memory block 7) corresponding to the redundancy column selection signal YCR<0>. Thus, as illustrated and described above with respect to FIG. 3, if column 12 in memory block 1 is defective, then the redundancy column select signal YCR<0> will be active at a high level when the column address ADDR[6:0] equals 0001100 (i.e., 12b) and all other redundancy column select signals YCR[3:1] will be inactive. The fuse box 71 will also generate the first fuse data signal F1[2:0] at a value equal to 001 (i.e., 1b), which identifies memory block 1 as corresponding to column address 12. The decoder 76 decodes the first 3-bit fuse data signal F1[2:0] into a first decoded data signal D1[7:0]. This first decoded data signal D1[7:0] will have a value equal to 00000010 for the case where F1[2:0] is set to a value equal to 001 (i.e., 1b). FIG. 7 is a table that illustrates the decoding operations performed by the decoders 76–79.

The gate unit 80 in FIG. 6 includes a plurality of OR gates, shown as OR1–OR8. These OR gates are configured to receive the decoded data signals D1[7:0], D2[7:0], D3[7:0] and D4[7:0] from the decoders 76–79. Based on this configuration of the gate unit 80, setting the first decoded data signal D1[7:0] to a value equal to 00000010, which reflects a defective column within memory block 1, will cause the input/output selection signal IOSLT<1> to be set high to a logic 1 level and the first column redundancy data line CRDL<0> to be routed to the input/output line IO<1> during data reading operations. The other input/output selection signals (i.e., IOSLT<0> and IOSLT[7:2]) will be low to logic 0 levels. The second input/output selection signal generating unit 172 is configured to be equivalent to the first input/output selection signal generating unit 171 and need not be described further herein.

One potential limitation of the memory device 100 of FIG. 1 is the requirement that not more than four (4) defective columns be present in memory blocks 0–7 and not more than four (4) defective columns be present in memory blocks 8–15. This limitation arises from the fact that the first redundant memory block RMB0 only contains redundant columns for memory blocks 0–7 and the second redundant memory block RMB1 only contains redundant columns for memory blocks 8–15. If the memory blocks 0–7 contain more than four defective columns, then the memory device 100 of FIG. 1 must be treated as defective and discarded. To address this limitation, a semiconductor memory device 800 according to additional embodiments of the present invention is provided. This memory device 800, which is illustrated by FIGS. 8–12, supports replacement of as many as eight (8) defective columns within the memory blocks 0–15 of FIG. 8. Stated alternatively, redundant columns from the first and second redundant memory blocks RMB0 and RMB1 within the redundant memory array 820 may be used to replace defective columns within either memory blocks 0–7 or memory blocks 8–15.

Figure 8:
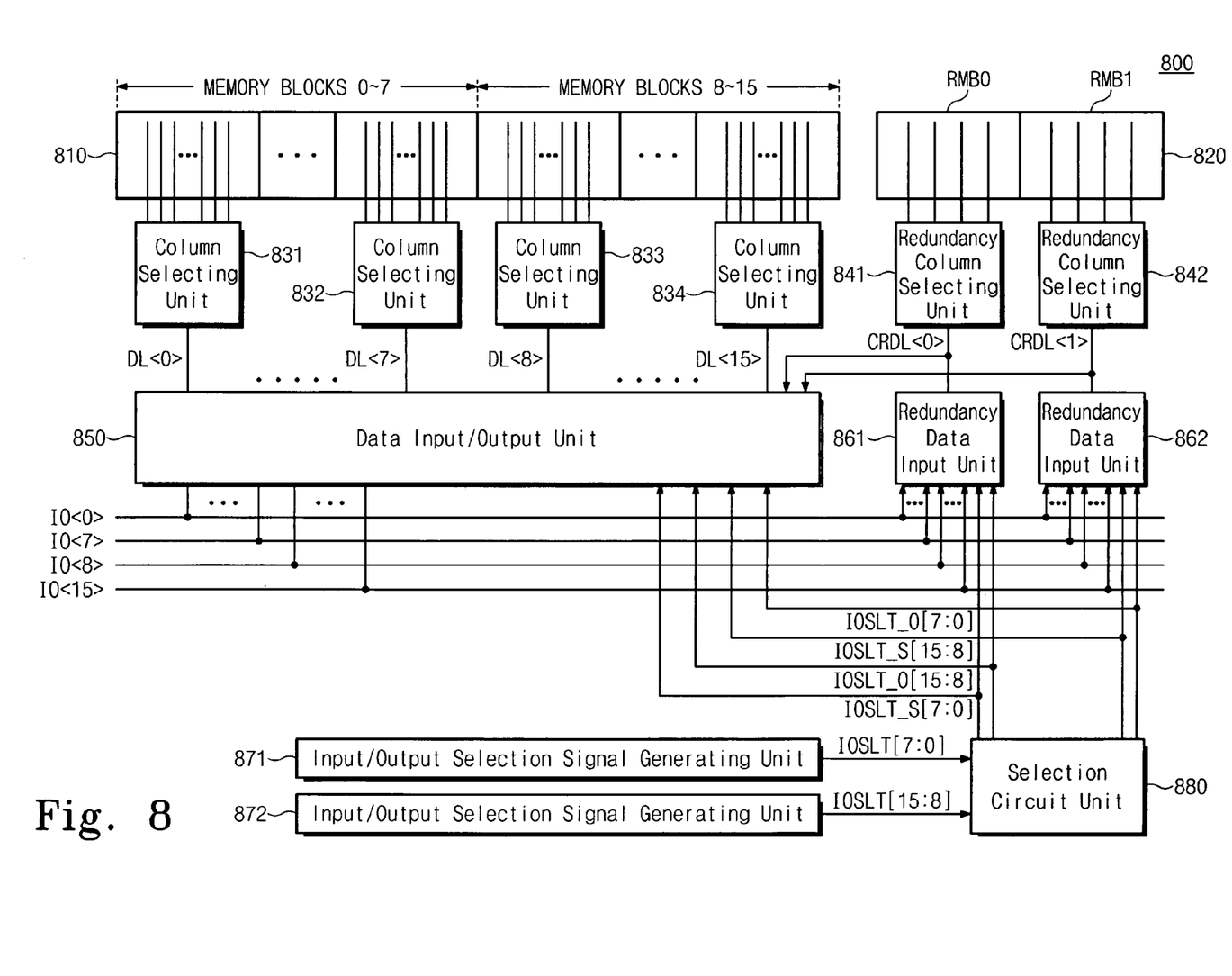
FIG. 8 is a block diagram of an integrated circuit memory device according to embodiments of the present invention.

In the memory device 800 of FIG. 8, the sixteen column selecting units, which are illustrated by the reference numerals 831–834, and the two redundancy column selecting units 841–842 may be configured identically to the corresponding selecting units of FIGS. 1–3 and need not be described further herein. In addition, the input/output selection signal generating units 871–872 may be equivalent to the input/output selection signal generating units 171 and 172 in FIG. 1. However, as will now be described, the data input/output unit 850, the first and second redundancy data input units 861 and 862 and the selection circuit unit 880 provide an additional degree of flexibility in repairing defective columns within the memory array 810. This additional degree of flexibility stems from an ability to provide more than four column redundancy repairs in either the lower half of the memory blocks 0–7 or the upper half of the memory blocks 8–15 within the memory array 810.

The data input/output unit 850 is electrically coupled to all sixteen data lines DL[15:0], all sixteen input/output lines IO[15:0] and both of the column redundancy data lines CRDL[1:0]. The data input/output unit 850 is also controlled by two pairs of input/output selection signals IOSLT_S [15:8] and IOSLT_S [7:0], where "S" designates "same", and IOSLT_O [15:8] and IOSLT_O [7:0], where "O" designates "other". These four input/output selection signals are generated by the selection circuit unit 880, which is responsive to the input/output selection signals IOSLT[15:0]. The first redundancy data input unit 861 is configured to receive input data from all of the input/output lines IO[15:0] and is configured to provide input data to the first column redundancy data line CRDL<0>. The first redundancy data input unit 861 is also responsive to a first pair of the input/output selection signals IOSLT_S [7:0] and IOSLT_O [15:8]. The second redundancy data input unit 862 is configured to receive input data from all of the input/output lines IO[15:0] and is configured to provide input data to the second column redundancy data line CRDL<1>. The second redundancy data input unit 862 is also responsive to a second pair of the input/output selection signals IOSLT_S [15:8] and IOSLT_O [7:0].

Figure 9:
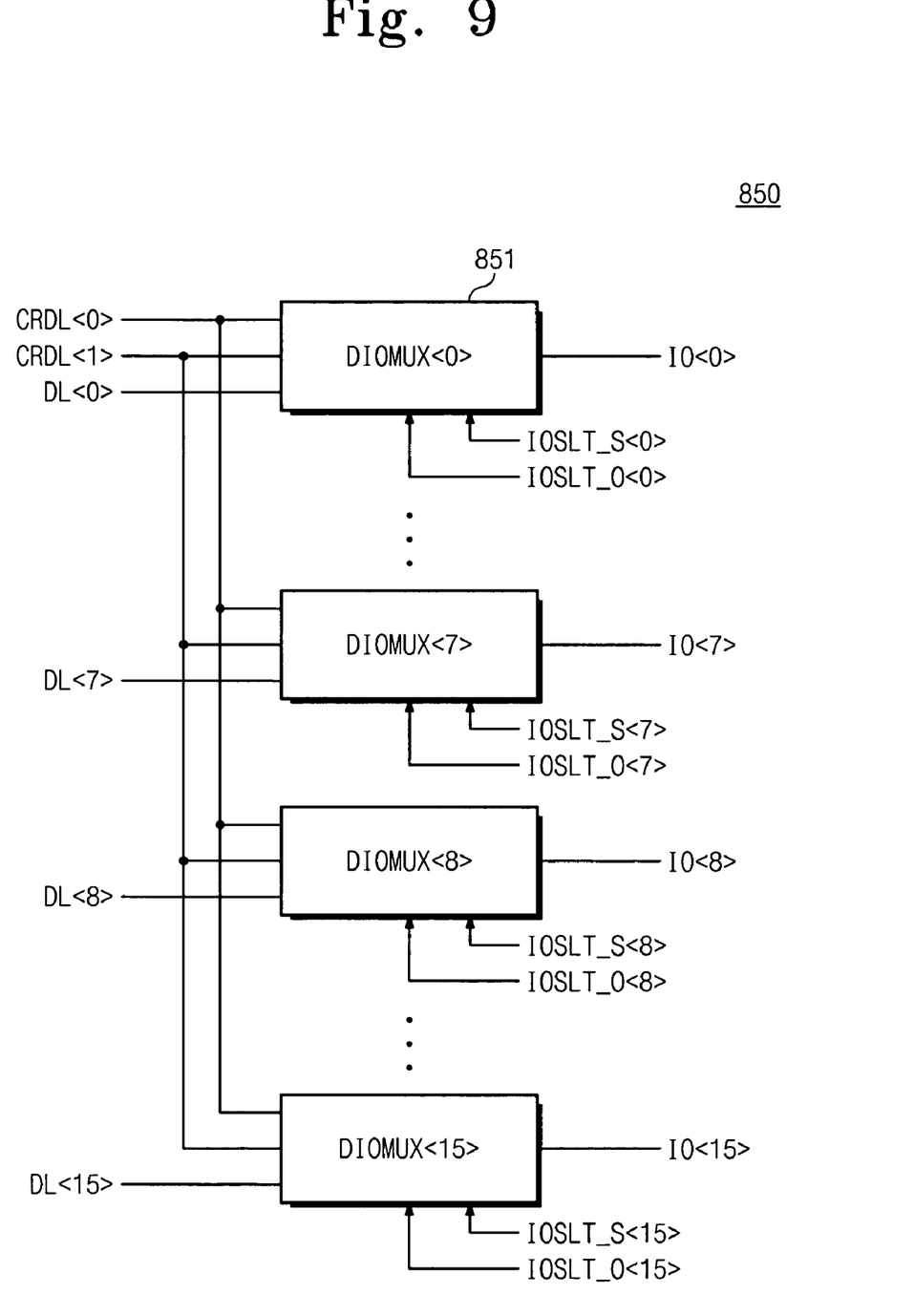
FIG. 9 is an electrical schematic of a data input/output unit illustrated by FIG. 8.

The data input/output unit 850 of FIG. 9 includes sixteen data input/output multiplexers 851, which are each responsive to a corresponding pair of input/output selection signals IOSLT_S<n> and IOSLT_O<n>, where "n" is an integer in a range from 0 to 15. Each data input/output multiplexer 851 is connected to a corresponding data line DL<n>, a corresponding input/output line IO<n> and both of the column redundancy data lines CRDL[1:0]. For the case where $0 \leq n \leq 7$, each data input/output multiplexer 851 (i.e., DIOMUX<0>, . . . , DIOMUX<7>) will electrically connect the first column redundancy data line CRDL<0> to the corresponding input/output line IO<n> when IOSLT_S<n>=1 and will connect the second column redundancy data line CRDL<1> to the corresponding input/output line IO<n> when IOSLT_O<n>=1. Moreover, when both IOSLT_S<n>=0 and IOSLT_O<n>=0, a data input/output multiplexer 851 will connect a corresponding data line DL<n> to the corresponding input/output line IO<n> for all values of "n" in the range from 0 to 15. Alternatively, for the case where $8 \leq n \leq 15$, each data input/output multiplexer 851 (i.e., DIOMUX<0>, . . . , DIOMUX<7>) will electrically connect the second column redundancy data line CRDL<1> to the corresponding input/output line IO<n> when IOSLT_S<n>=1 and will connect the first column redundancy data line CRDL<0> to the corresponding input/output line IO<n> when IOSLT_O<n>=1.

Figure 10:
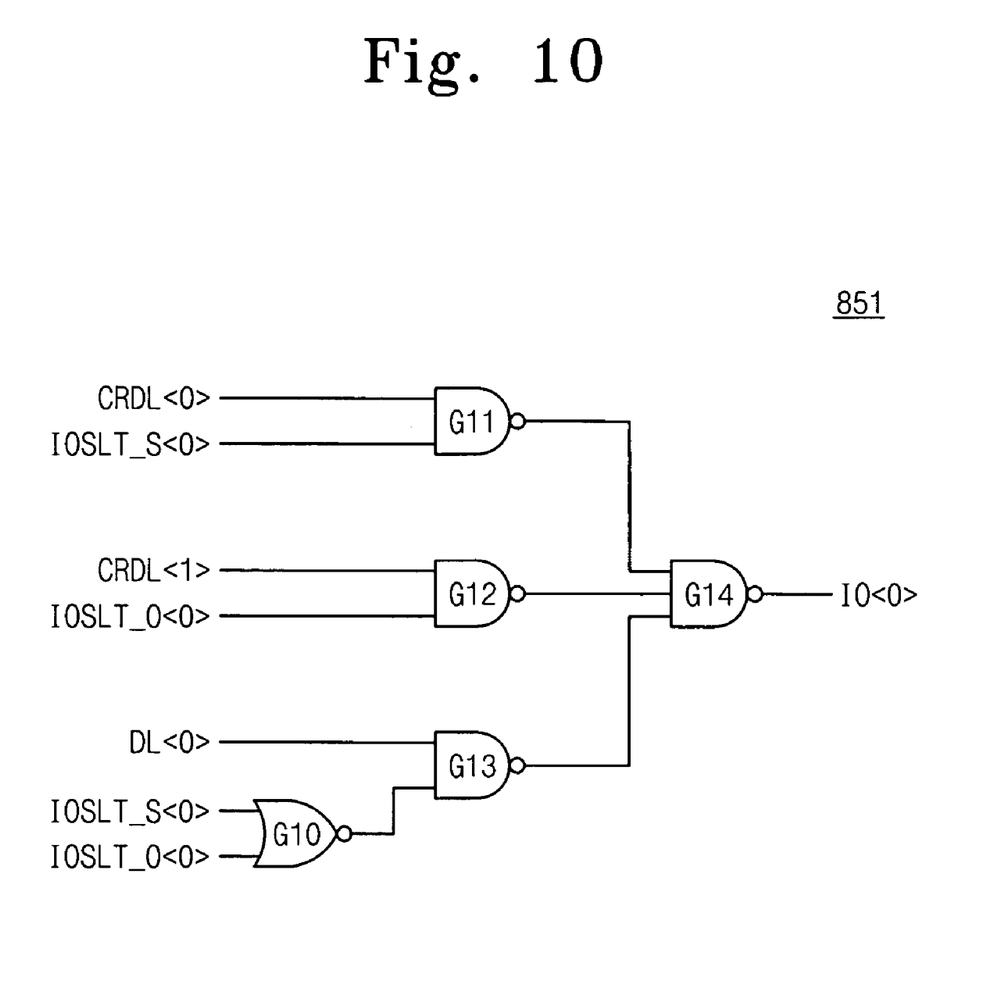
FIG. 10 is an electrical schematic of a data input/output multiplexer (DIOMUX) illustrated in FIG. 9.

FIG. 10 illustrates a data input/output multiplexer 851 for the case where n=0. This data input/output multiplexer 851 includes a NOR gate G10 and four NAND gates G11–G14, connected as illustrated. Based on this configuration of the data input/output multiplexer 851, setting IOSLT_S<0> to an active high level will cause data to be routed from the first column redundancy data line CRDL<0> to the input/output line IO<0> during memory reading operations. Alternatively, setting IOSLT_O<0> to an active high level will cause data to be routed from the second column redundancy data line CRDL<1> to the input/output line IO<0> during memory reading operations. These routing operations are performed subject to the constraint that IOSLT_S<0> and IOSLT_O<0> cannot be active at the same time. Finally, when IOSLT_S<0>=IOSLT_O<0>=0, then the output of the NOR gate G10 will be set high and data will be routed from the corresponding data line DL<0> to the corresponding input/output line IO<0> during reading and writing operations.

Figure 11:
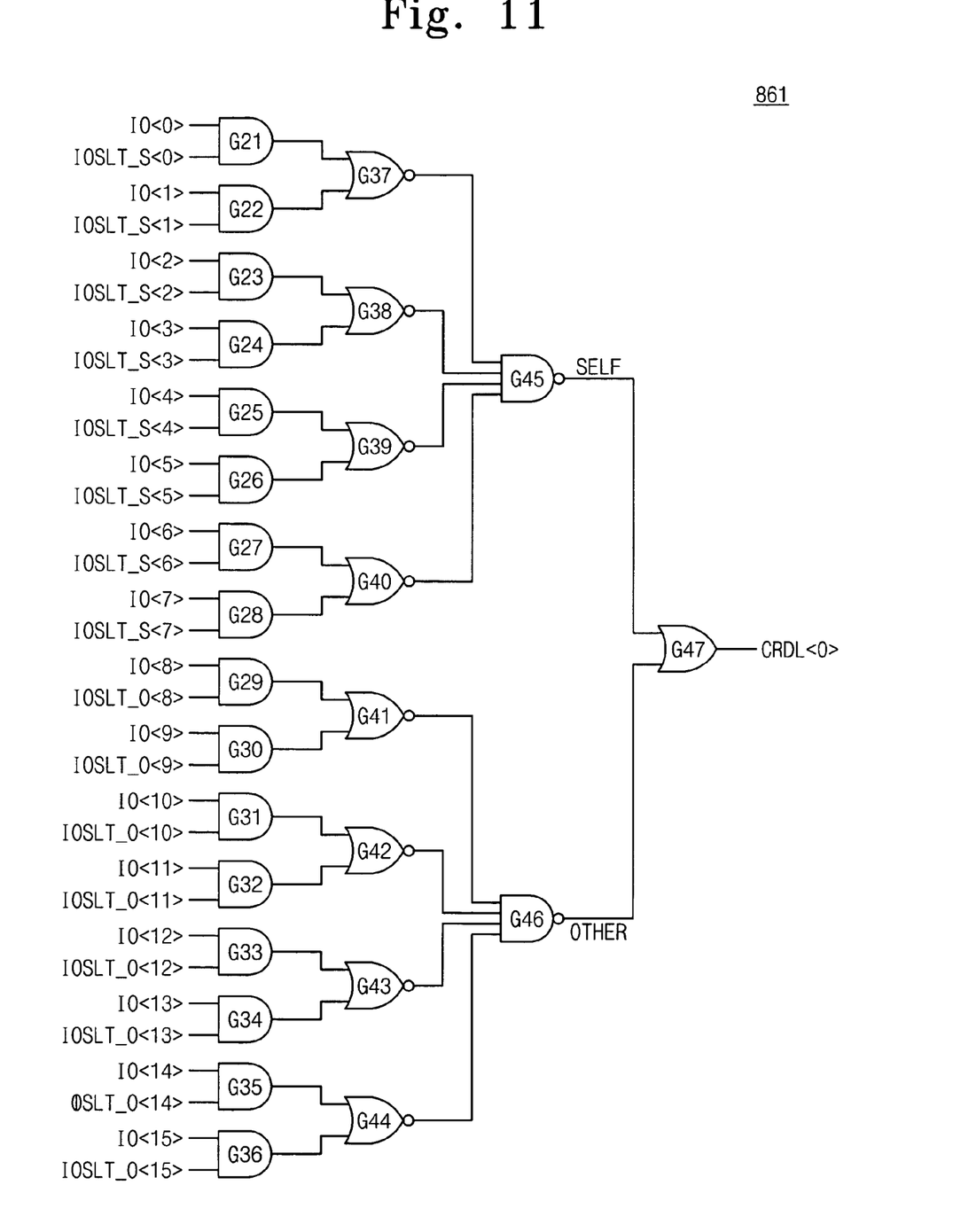
FIG. 11 is an electrical schematic of a redundancy data input unit illustrated by FIG. 8.

FIG. 11 is a detailed electrical schematic of the first redundancy data input unit 861. This first redundancy data input unit 861 includes a top half associated with the incoming "self" signals (i.e., IOSLT_S) and a bottom half associated with the incoming "other" signals (i.e., IOSLT_O). In particular, the top half includes AND gates G21–G28, NOR gates G37–G40 and a 4-input NAND gate G45, which generates signal SELF. This top half is similar to the detailed electrical schematic of the first redundancy data input unit 161 of FIG. 5. The bottom half of the first redundancy data input unit 861 includes AND gates G29–G36, NOR gates G41–G44 and a 4-input NAND gate G46, which generates signal OTHER. The signals SELF and OTHER are provided to an output OR gate G47 which is connected to the first column redundancy data line CRDL<0>. Based on this configuration of the first redundancy data input unit 861, data can be routed from selected ones of the input/output lines IO[7:0] to CRDL<0> when a corresponding one of the "self" input/output selection signals IOSLT_S<n> is active, for the case where 0≦n≦7. Alternatively, data can be routed from selected ones of the input/output lines IO[15:8] to CRDL<0> when a corresponding one of the "other" input/output selection signals IOSLT_O<n> is active, for the case where 8≦n≦15.

Figure 12:
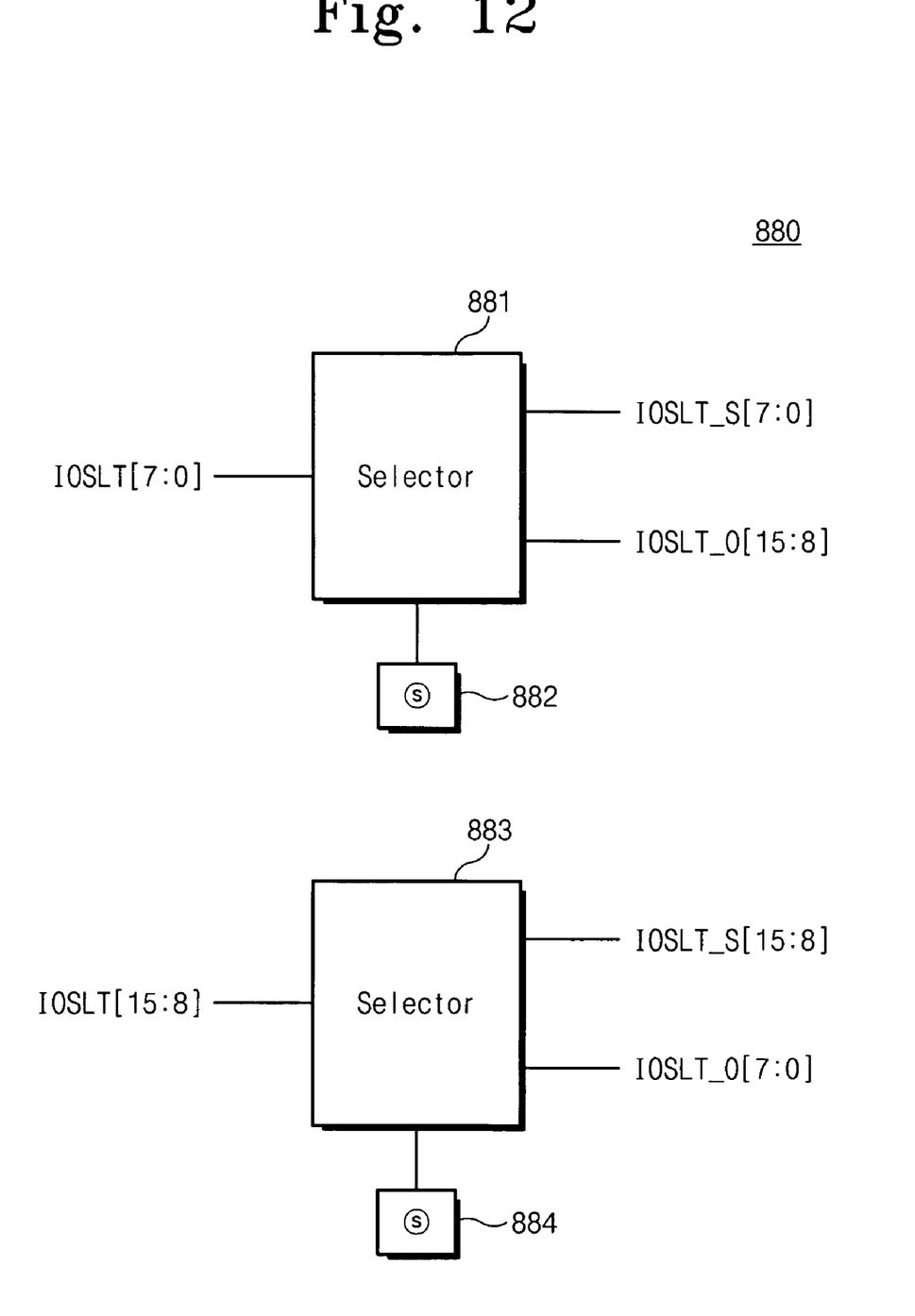
FIG. 12 is an electrical schematic of a selection circuit unit illustrated by FIG. 8.

In FIG. 12, the selection circuit unit 880 of FIG. 8 is illustrated as including a pair of selectors 881 and 883 that are responsive to corresponding groups of the input/output selection signals IOSLT[7:0] and IOSLT[15:8], which are generated by the first and second input/output selection generation units 871 and 872. As illustrated, the first selector 881 is configured to generate signals IOSLT_S [7:0] and IOSLT_O[15:8] in response to the input/output selection signals IOSLT[7:0]. A fuse device 882 is provided so that the input/output selection signal IOSLT[7:0] can be properly decoded by the first selector 881. By setting this fuse device 882 in a particular manner, redundant columns within the first redundant memory block RMB0 can be used to replace one or as many as four defective columns within memory blocks 8–15 in addition to providing column repair capability for memory blocks 0–7. The second selector 883 is configured to generate signals IOSLT_S [15:8] and IOSLT_O[7:0] in response to the input/output selection signals IOSLT[15:8]. A fuse device 884 is provided so that the input/output selection signal IOSLT[15:8] can be properly decoded by the second selector 883. By setting this fuse device 884 in a particular manner, redundant columns within the second redundant memory block RMB1 can be used to replace one or as many as four defective columns within memory blocks 0–7 in addition to providing column repair capability for memory blocks 15–8. Thus, greater repair flexibility is achieved using the memory device embodiment of FIG. 8 relative to the memory device embodiment of FIG. 1.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:
    a memory array having a plurality of multi-column memory blocks therein;
    a multi-column redundant memory array;
    a redundancy column selecting unit configured to route data read from said multi-column redundant memory array to a redundant data line, in response to a column address;
    a data input/output unit connected to the redundant data line and a data line associated with a defective column in said memory array, said data input/output unit configured to respond to an instruction to read first data from the defective column in said memory array by routing first data read from a selected redundant column in said multi-column redundant memory array to an input/output bus while concurrently blocking data read from the defective column from being transferred to the input/output; and
    a redundancy data input unit having an output connected to the redundant data line, a first plurality of inputs connected to the input/output bus and a second plurality of inputs responsive to a plurality of input/output selection signals.

2. The memory device of claim 1, wherein said redundancy column selecting unit comprises a fuse box configured to generate a plurality of redundancy column selection signals in response to the column address; and wherein said data input/output unit is responsive to the plurality of input/output selection signals.

3. The memory device of claim 2, further comprising an input/output selection signal generating unit configured to generate the plurality of input/output selection signals in response to the plurality of redundancy column selection signals.

4. The memory device of claim 3, wherein said data input/output unit comprises a multiplexer having first and second data terminals electrically connected to the data line and the redundant data line and a control terminal responsive to a corresponding one of the input/output selection signals.

5. The memory device of claim 2, wherein said data input/output unit comprises a multiplexer having first and second data terminals electrically connected to the data line and the redundant data line and a control terminal responsive to a corresponding one of the input/output selection signals.

6. The memory device of claim 3, wherein the input/output selection signal generating unit comprises a decoding unit responsive to the plurality of redundancy column selection signals.

7. The memory device of claim 6, wherein the decoding unit comprises a plurality of fuse boxes responsive to the plurality of redundancy column selection signals.

* * * * *